United States Patent
Noma et al.

(10) Patent No.: US 7,456,083 B2
(45) Date of Patent: Nov. 25, 2008

(54) SEMICONDUCTOR DEVICE AND MANUFACTURING METHOD OF THE SAME

(75) Inventors: Takashi Noma, Ota (JP); Yoshinori Seki, Gunma (JP); Motoaki Wakui, Kumagaya (JP)

(73) Assignees: Sanyo Electric Co., Ltd., Osaka (JP); Kanto Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 11/069,061

(22) Filed: Mar. 2, 2005

(65) Prior Publication Data
US 2005/0208735 A1    Sep. 22, 2005

(30) Foreign Application Priority Data
Mar. 5, 2004    (JP)    .............. 2004-062323

(51) Int. Cl.
 *H01L 21/301*    (2006.01)
(52) U.S. Cl. .................. 438/460; 438/401; 438/16; 257/797
(58) Field of Classification Search .................. 438/460, 438/401, 16; 257/797
See application file for complete search history.

(56) References Cited

U.S. PATENT DOCUMENTS

| | | | |
|---|---|---|---|
| 4,569,326 A | 2/1986 | Tanizaki et al. | |
| 5,777,392 A | 7/1998 | Fuji | |
| 5,916,460 A * | 6/1999 | Imoto et al. ............. | 219/121.67 |
| 6,271,102 B1 | 8/2001 | Brouillette et al. | |
| 6,309,943 B1 | 10/2001 | Glenn et al. | |
| 6,579,738 B2 * | 6/2003 | Farrar et al. .................... | 438/33 |
| 6,646,289 B1 | 11/2003 | Badehi | |
| 6,869,861 B1 * | 3/2005 | Glenn et al. ................ | 438/462 |
| 2003/0038367 A1 | 2/2003 | Yamaguchi | |
| 2003/0211709 A1 | 11/2003 | Ohsumi et al. | |

FOREIGN PATENT DOCUMENTS

| | | |
|---|---|---|
| JP | 08-264423 A | 10/1996 |
| JP | 2002-512436 T | 4/2002 |
| WO | 99/40624 | 8/1999 |

* cited by examiner

*Primary Examiner*—Leonardo Andújar
(74) *Attorney, Agent, or Firm*—Morrison & Foerster LLP

(57) ABSTRACT

The invention is directed to an improvement of cutting accuracy in a cutting process when a semiconductor device attached with a supporting member is manufactured. The invention provides a manufacturing method of a semiconductor device where a semiconductor wafer attached with a glass substrate is cut with moving a rotation blade along a dicing region and has following features. A pair of alignment marks is formed facing each other over the dicing region on the semiconductor wafer. Then, when the rotation blade is to be aligned on a center of the dicing region, that is, on a centerline thereof in the cutting process, positions of the alignment marks are detected by a recognition camera, the centerline is calculated based on the detection result, and the rotation blade is aligned on the centerline to perform cutting.

13 Claims, 8 Drawing Sheets

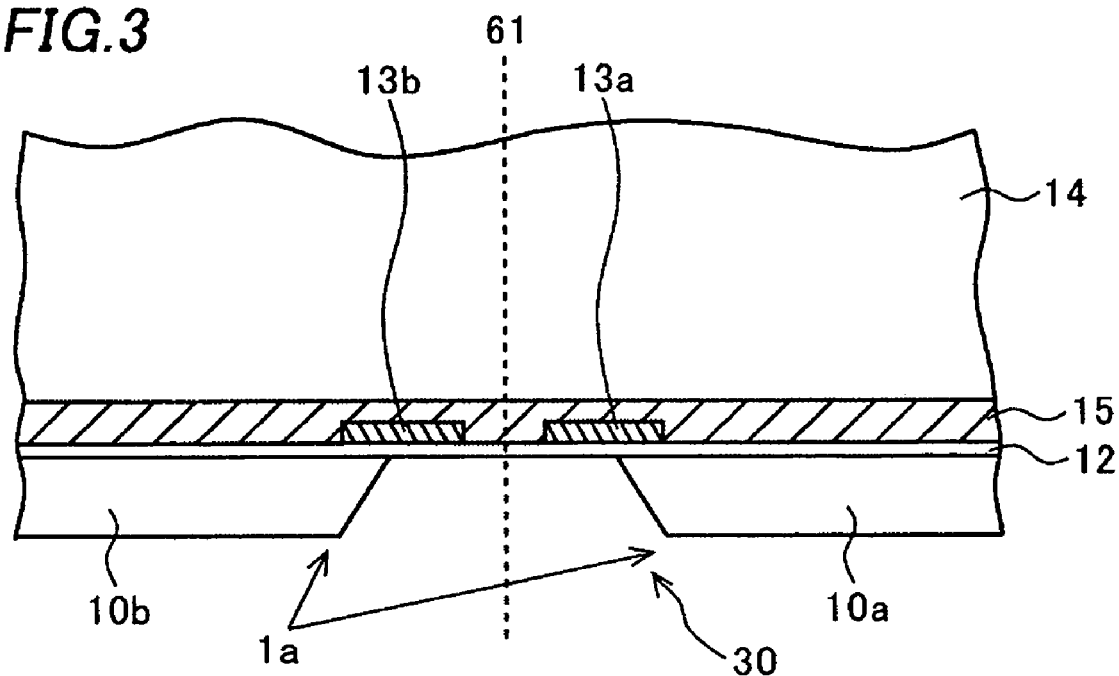
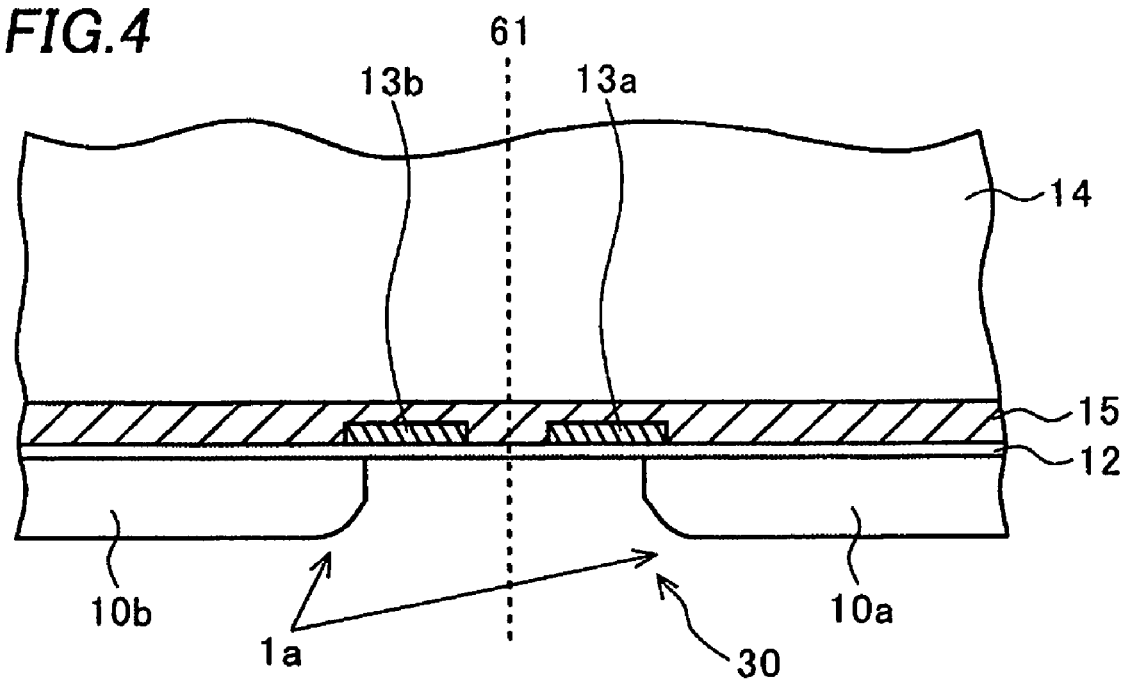

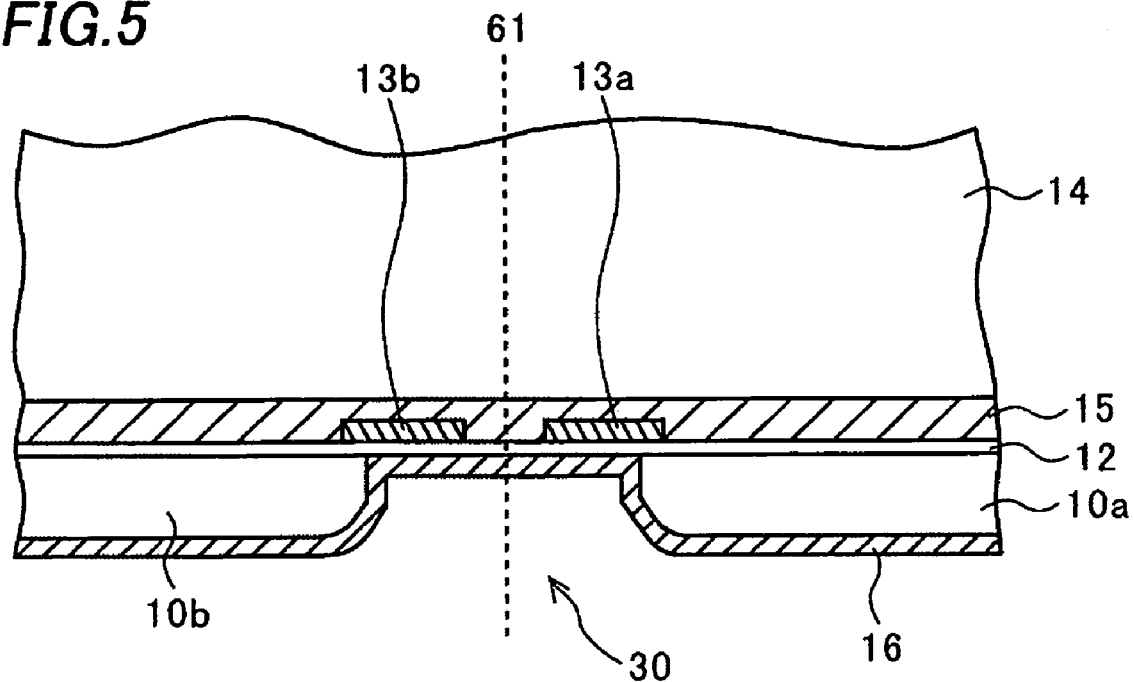
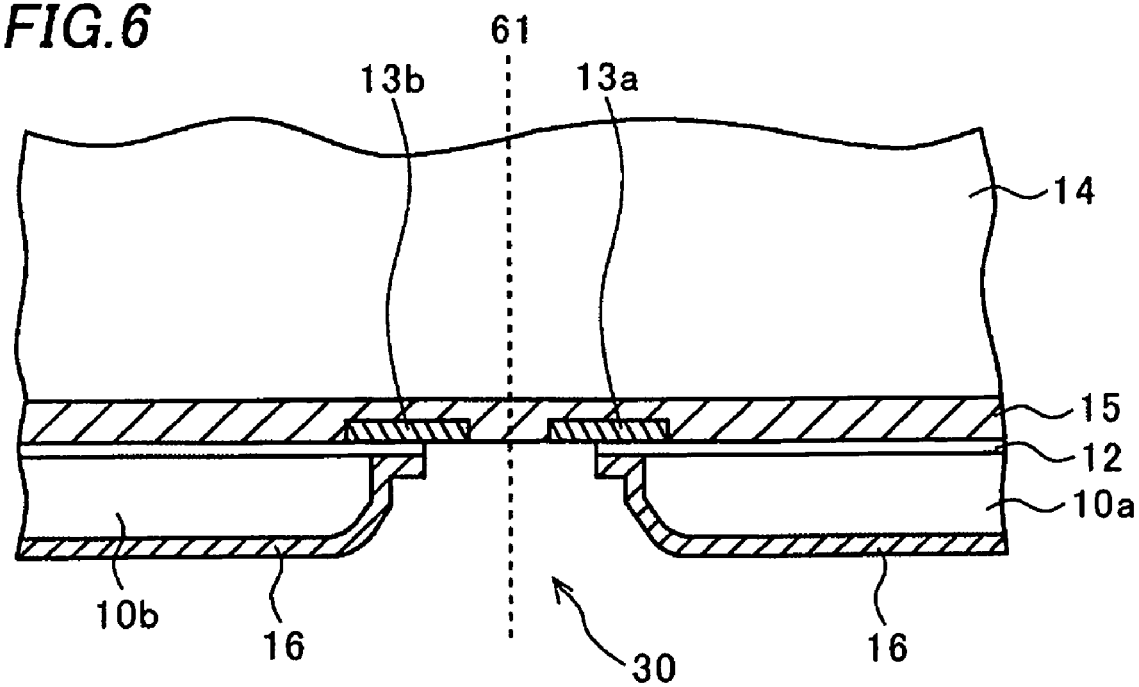

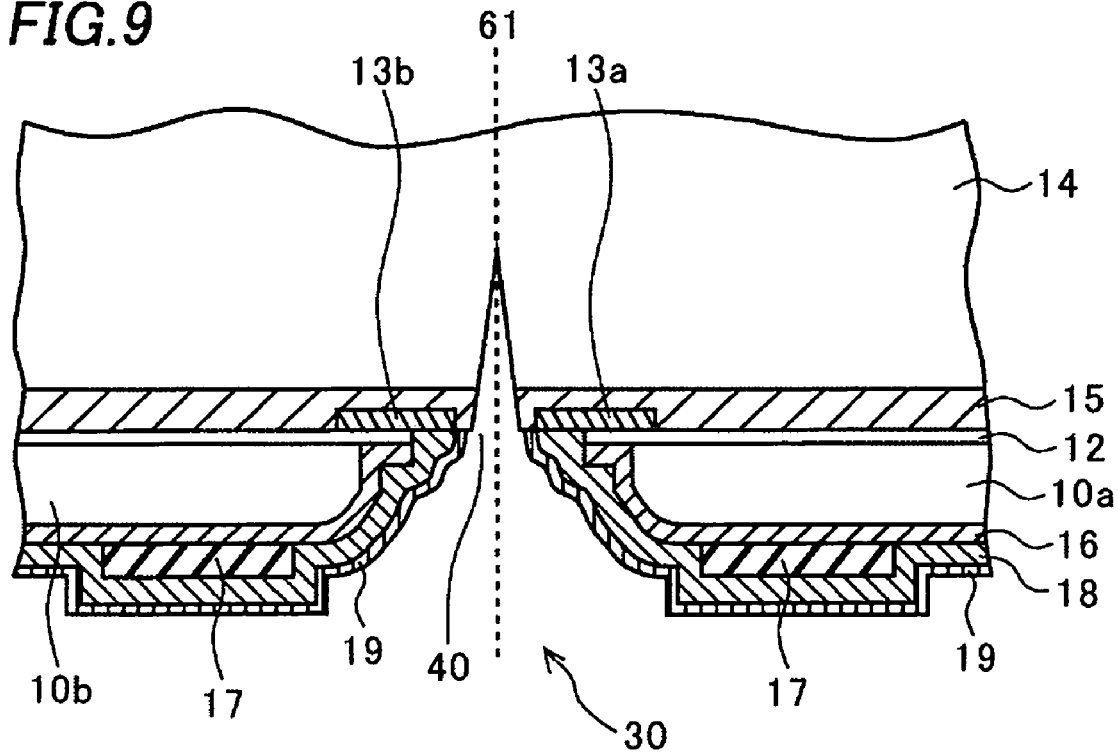
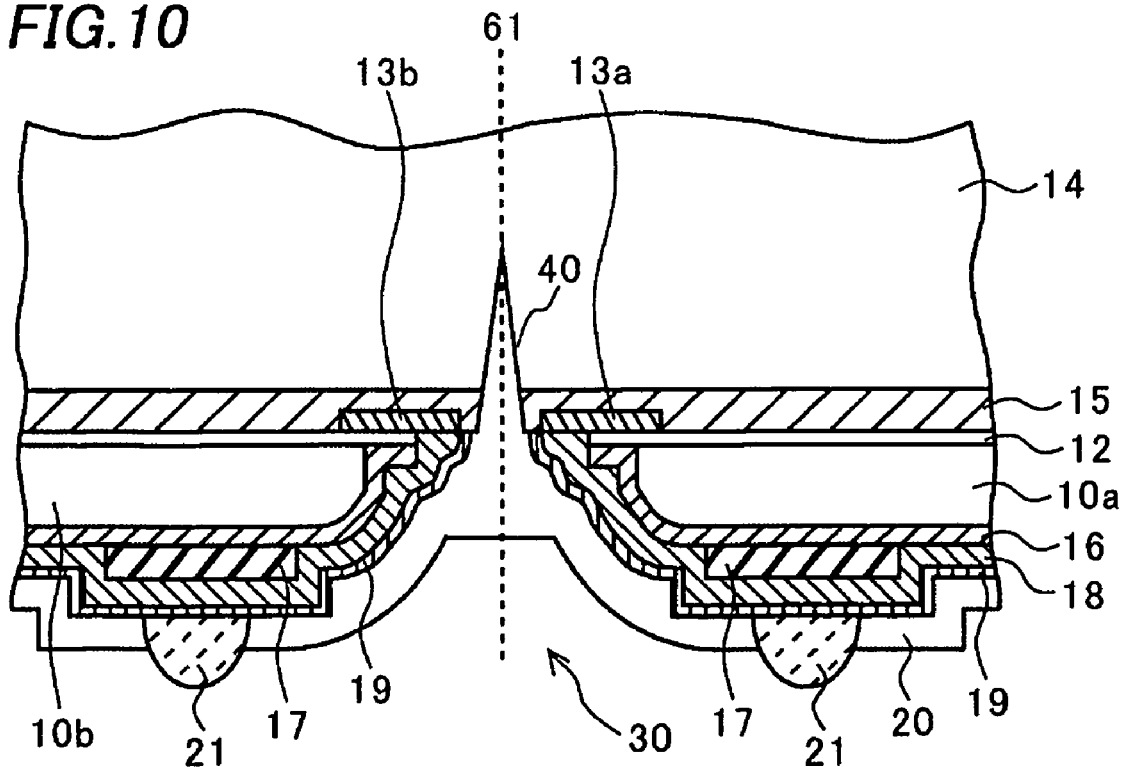

SEMICONDUCTOR DEVICE AND MANUFACTURING METHOD OF THE SAME

CROSS-REFERENCE OF THE INVENTION

This invention is based on Japanese Patent Application No. 2004-062323, the content of which is incorporated by reference in its entirety.

BACKGROUND OF THE INVENTION

1. Field of the Invention

This invention relates to a semiconductor device and a manufacturing method thereof, particularly, to a semiconductor device and a manufacturing method thereof in a cutting process of a semiconductor wafer attached with a supporting member.

2. Description of the Related Art

Conventionally, BGA (Ball Grip Array) type semiconductor devices have been known as a kind of a chip size package having almost same outside dimensions as those of a semiconductor die. In such a BGA type semiconductor device, a plurality of ball-shaped conductive terminals made of metal such as solder is arrayed in a grid pattern on one surface of the package, and electrically connected with the semiconductor die mounted on another surface of the package.

When this BGA type semiconductor device is mounted on electronic equipment, the semiconductor die is electrically connected with an external circuit on a printed circuit board by compression bonding of the conductive terminals to wiring patterns on the printed circuit board.

Such a BGA type semiconductor device has advantages in providing a large number of conductive terminals and in reducing size over other type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

FIGS. 13A and 13B are schematic views of a conventional BGA type semiconductor device. FIG. 13A is a perspective view of the BGA type semiconductor device on its front side. FIG. 13B is a perspective view of the BGA type semiconductor device on its back surface.

A semiconductor die 101 is sealed between a first glass substrate 104a and a second glass substrate 104b serving as supporting members through resin 105a and 105b in the BGA type semiconductor device 100. A plurality of ball-shaped terminals (referred to as conductive terminals 111, hereafter) is arrayed in a grid pattern on a surface of the second glass substrate 104b, that is, on a back surface of the BGA type semiconductor device 100. The conductive terminals 111 are connected to the semiconductor dies 101 through second wirings 109. The plurality of second wirings 109 is connected with aluminum wirings pulled out from inside of the semiconductor dies 101, making the conductive terminals 111 electrically connected with the semiconductor dies 101.

Further explanation on a cross-sectional structure of the BGA type semiconductor device 100 will be given hereafter referring to FIG. 14. FIG. 14 shows a cross-sectional view of the BGA type semiconductor device 100 separated into individual dies along dicing lines.

A first wiring 103 is provided on an insulation film 102 on a front surface of the semiconductor die 101. The semiconductor die 101 is attached to the first glass substrate 104a with the resin 105a. A back surface of the semiconductor die 101 is attached to the second glass substrate 104b with the resin 105b. One end of the first wiring 103 is connected to the second wiring 109. The second wiring 109 extends from the end of the first wiring 103 onto a surface of the second glass substrate 104b. The ball-shaped conductive terminal 111 is formed on the second wiring 109 extended onto the second glass substrate 104b.

The technology mentioned above is disclosed, for example, in Japanese Patent Application Publication No. 2002-512436.

In the manufacturing method described above, when the semiconductor wafer attached with the first and second glass substrates 104a and 104b is separated into individual dies along the dicing line, a dicing blade for cutting is aligned on a center of the dicing line. However, conventionally, it has been difficult to align the dicing blade on the center accurately, causing a problem of lowering cutting accuracy in dicing.

SUMMARY OF THE INVENTION

The invention provides a method of manufacturing a semiconductor device. The method includes providing a semiconductor wafer having a layer disposed on the front surface of the semiconductor wafer, a first electrode pad and a second electrode pad that are formed on the front surface, and a supporting member attached to the front surface. The method also includes forming on a back surface of the semiconductor wafer a first alignment mark and a second alignment mark, detecting positions of the first and second alignment marks, calculating a middle position of the positions of the first and second alignment marks, placing a blade at the calculated middle position on a side of the semiconductor wafer corresponding to the back surface, and cutting using the aligned blade the layer disposed on the front surface between the first and second electrode pads and along a predetermined direction so that the blade reaches the semiconductor wafer.

The invention also provides a semiconductor device that includes a semiconductor die, a pad electrode disposed on the front surface of the semiconductor die, a supporting member attached to the front surface, and an alignment mark disposed on the back surface of the semiconductor die.

BRIEF DESCRIPTION OF THE DRAWINGS

FIGS. 2-11 show cross-sectional views of device intermediates at successive process steps to manufacture the semiconductor device of the embodiment of the invention.

DETAILED DESCRIPTION OF THE INVENTION

Figure 1:
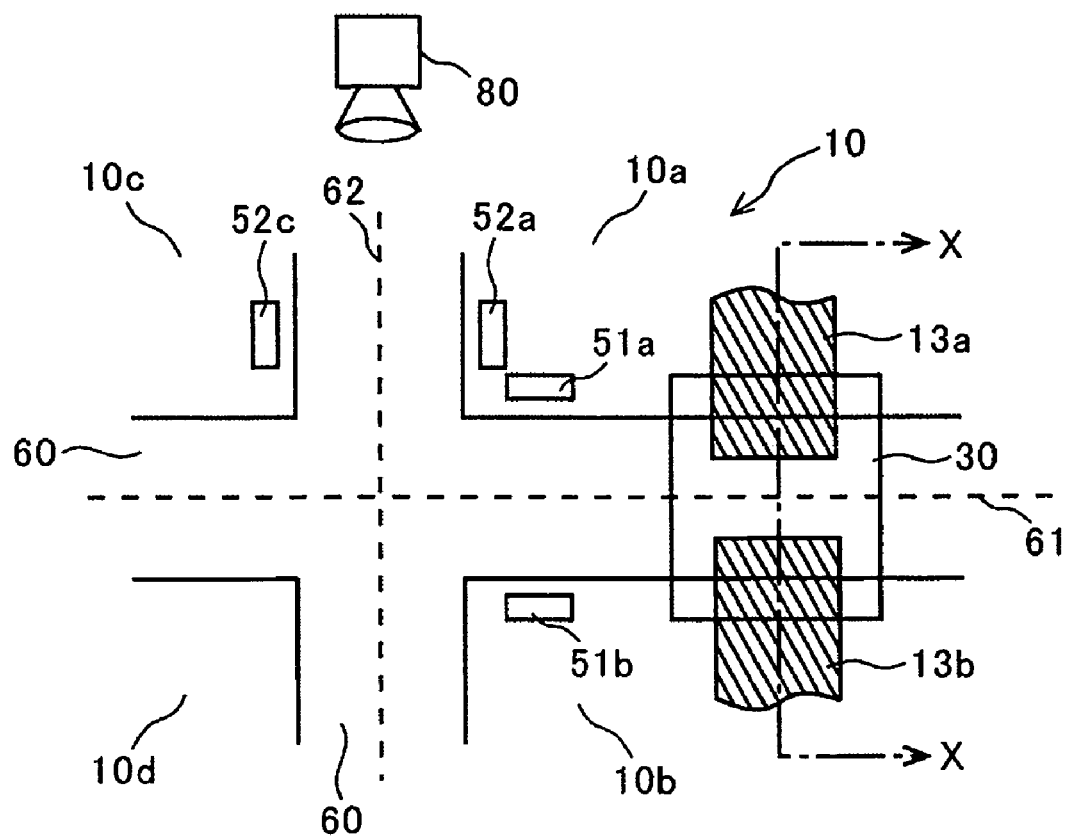
FIG. 1 is a plan view for explaining a manufacturing method of a semiconductor device of an embodiment of the invention.

A manufacturing method of a semiconductor device of an embodiment of the invention will be described with reference to a plan view of FIG. 1. FIG. 1 is a top view of a semiconductor wafer 10 during processing to manufacture the semiconductor device of the embodiment. Note that the front surface of the wafer 10 is shown in FIG. 1 with dice regions, and the back surface of the wafer 10 is attached to a supporting member (not shown in FIG. 1).

As shown in FIG. 1, semiconductor die regions 10a, 10b, 10c, and 10d and other semiconductor die regions (not shown), which will be individual semiconductor dies by separating the semiconductor wafer 10, are disposed along dicing regions 60 perpendicularly crossing each other. First wirings 13a and 13b which are pads extending from circuits (not shown) formed on the semiconductor die regions are formed in the adjacent semiconductor die regions 10a and 10b, respectively, along the dicing region of the semiconductor wafer. In a position where the first wirings 13a and 13b are formed on the semiconductor wafer, a window 30 is formed so as to expose the first wirings 13a and 13b by selective etching, for example. This window 30 is an opening for connecting the first wirings 13a and 13b and second wirings to be formed in the semiconductor die regions 10a and 10b of the semiconductor wafer (wirings for connecting the first wirings and conductive terminals to be formed on the semiconductor wafer).

It is noted that the semiconductor die regions 10c and 10d and the other semiconductor die regions (not shown) also have the same structure as described above.

Furthermore, alignment marks (51a, 51b) (52a, 52c) are respectively formed facing each other near the dicing regions 60 in corners of the semiconductor die regions 10a, 10b, 10c, and 10d, and the semiconductor die regions (not shown) of the semiconductor wafer, that is, near intersections of the crossing dicing regions 6, and near boundaries between the semiconductor die regions and the dicing regions 60. These alignment marks (51a, 51b) (52a, 52c) are protruded, for example, and used for alignment of a rotation blade on a predetermined cutting position in a cutting process for cutting the semiconductor wafer 10 or the glass substrate.

The alignment of the rotation blade is performed by detecting the alignment marks (51a, 51b) (52a, 52c) by a recognition camera 80 for image recognition, calculating centerlines of the dicing regions 60 based on the detection result, and aligning the rotation blade on the centerlines.

These alignment marks (51a, 51b) (52a, 52c) are formed, having a following positional relationship, for example. The pair of alignment marks 51a and 51b is formed in the semiconductor die regions 10a and 10b respectively, facing each other near the dicing region 60 extending along a centerline 61 as a dicing line. The pair of alignment marks 52a and 52c is formed in the semiconductor die regions 10a and 10c respectively, facing each other near the dicing region 60 extending along a centerline 62. That is, the two pairs of alignment marks are formed near the intersection of the dicing regions 60.

In a similar manner, a pair of alignment marks is formed near each of the dicing regions 60 extending along the centerlines 61 and 62 near each of other intersections of the dicing regions 60, too, facing each other. That is, two pairs of alignment marks are formed near each of the intersections of the dicing regions 60.

Although the two pairs of alignment marks are formed near each of the intersections of the dicing regions 60 in this embodiment, modifications are possible. For example, in FIG. 1, it is possible that a pair of alignment marks (not shown) is formed in each of the semiconductor die regions 10c and 10d, facing each other near the dicing region 60 extending along the centerline 61, and a pair of alignment marks (not shown) is formed in each of the semiconductor die regions 10b and 10d, facing each other near the dicing region 60 extending along the centerline 62. This can improve accuracy of alignment mark recognition.

Although a material of the alignment marks is not particularly limited as long as the marks can be detected by the recognition camera 80 for image recognition, it is preferable to use a material generally used in a manufacturing process of a semiconductor device. For example, it can be the same material as the material of the first wiring and the wiring formed on the semiconductor wafer. The alignment marks can be protrusions or hollows formed by etching.

The alignment of the rotation blade using the alignment marks described above can be applied to a semiconductor device manufacturing method shown hereafter, for example. The semiconductor device manufacturing method will be described with reference to cross-sectional views of FIGS. 2 to 11. FIGS. 2 to 11 show cross-sectional views of the semiconductor die regions 10a and 10b and the dicing regions 60 along line X-X in the semiconductor wafer of FIG. 1. The other semiconductor die regions have the same structure as that shown in these cross-sectional views, too.

Figure 2:
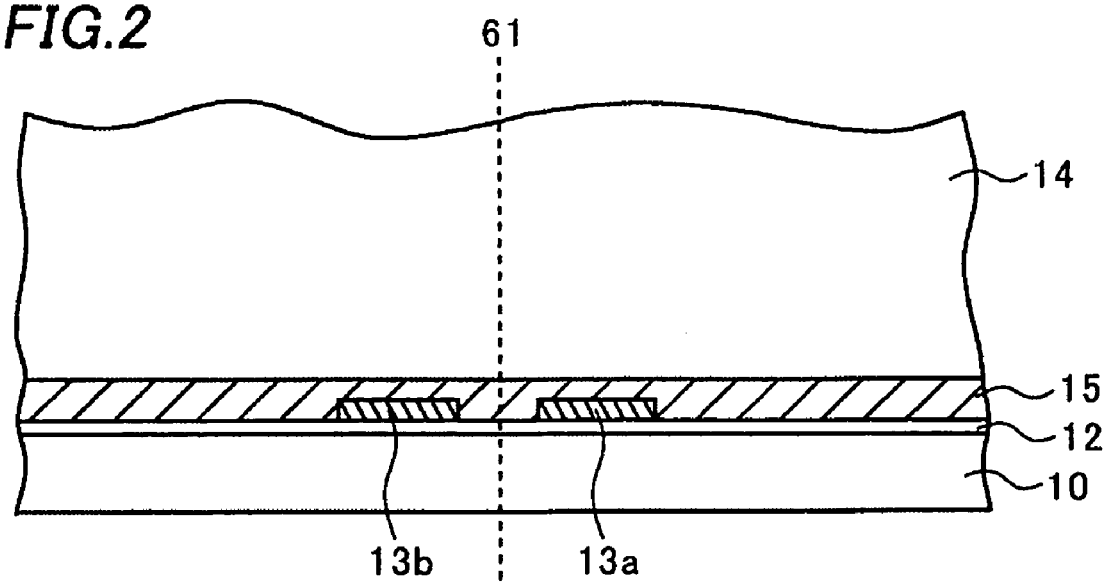

First, the semiconductor wafer 10 formed with circuits (not shown) is prepared as shown in FIG. 2. The pair of first wirings 13a and 13b (wirings electrically connected with the circuits (not shown)) are formed on two sides of the centerline 61 (a center of the dicing region, i.e. a dicing line) respectively on the semiconductor wafer 10 with a first insulation film 12 interposed therebetween. A passivation film (not shown) made of a silicon oxide film or a silicon nitride film is formed on the semiconductor wafer 10 including the first wirings 13a and 13b.

A glass substrate 14 as a supporting member is attached to a surface of the semiconductor wafer on the side formed with the first wirings 13a and 13b (referred to as a front surface of the semiconductor wafer 10, hereafter) with resin 15 (e.g. epoxy resin) interposed therebetween. The supporting member is not limited to the glass substrate, and a substrate or a tape made of metal or an organic material can be used as the supporting member, for example.

Then, a back surface of the semiconductor wafer 10, where the first wirings 13a and 13b are not formed, is ground to be thinned. Here, the ground back surface of the semiconductor wafer 10 has small concave and convex portions which will be reflected in other layers or wirings to be formed on the semiconductor wafer afterward. Therefore, wet-etching can be performed to the ground back surface of the semiconductor wafer 10.

Next, as shown in FIG. 3, a window 30 is formed in the semiconductor wafer 10 in a position corresponding to the first wirings 13a and 13b by selectively etching the back surface of the semiconductor wafer 10, serving as an opening exposing the first insulation film 12 formed on a part of the first wirings 13a and 13b. This window 30 is provided for connecting the first wirings 13a and 13b with second wirings to be formed on the back surface of the semiconductor wafer 10 afterward. The window 30 is not formed along the entire dicing region 60, that is, along all the centerline 61 but formed only in the position corresponding to the first wirings 13a and 13b, so that a contact area between the semiconductor wafer 10 and the glass substrate 14 is increased. This can reduce cracks or separation in the contact area, thereby preventing a yield decrease of the semiconductor device.

Corners are formed in end portions 1a of the semiconductor wafer 10 in the window 30.

The corners degrade step coverage of the other layers and wirings to be formed on the semiconductor wafer 10 afterward. Therefore, as shown in FIG. 4, wet-etching (or dip-etching) is performed to make the corners round.

The alignment marks 51a, 51b, 52a, and 52c and other alignment marks (not shown) for aligning the rotation blade are formed near the intersections of the dicing regions 60 extending along the centerlines 61 and 62 on the back surface of the semiconductor wafer 10.

Then, as shown in FIG. 5, a second insulation film 16 (e.g. an oxide film of 3 µm using silane as a base) is formed on the back surface of the semiconductor wafer 10. At this time, although the alignment marks are covered with the second insulation film 16, since the alignment marks are protruded or hollowed in predetermined positions, the protrusions or hollows detectable by the recognition camera 80 are formed in the predetermined positions even on the second insulation film 16.

Alternatively, in a case where the alignment marks are formed of a metal layer, the alignment marks can be detected by the recognition camera 80 even when the alignment marks are covered with the second insulation film 16, since the second insulation film 16 forms the protrusions reflecting the metal layer.

Next, a resist film (not shown) is formed on the second insulation film 16, having an opening near the centerline 61 (near the centerline 62 in the other region formed with the first wiring) in the window 30. Etching is performed to the back surface of the semiconductor wafer 10 by using this resist film as a mask. By this process, a part of the second insulation film 16 and the first insulation film 12 is removed near the centerline 61 to expose a part of the first wirings 13a and 13b, as shown in FIG. 6.

Figure 7:
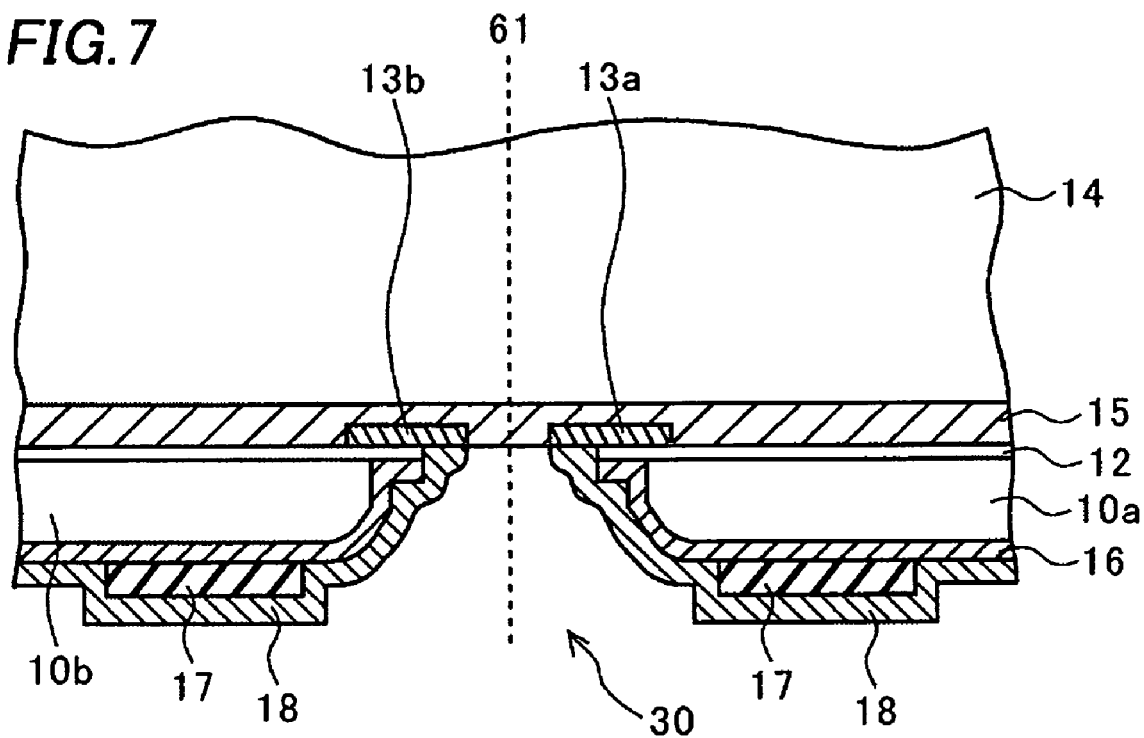

After the resist film (not shown) is removed, as shown in FIG. 7, cushioning members 17 are formed in predetermined positions on the second insulation film 16. These cushioning members 17 are provided for absorbing stress applied to the conductive terminals to be formed in these positions afterward, and has a function of relaxing stress applied when the conductive terminals are attached to the printed circuit board.

Furthermore, a metal layer for second wirings 18 is formed on the second insulation film 16 including on the cushioning members 17. At this time, the first wirings 13a and 13b are electrically connected with the second wirings 18. Then, a resist film (not shown) is formed, being patterned to be opened in a region near the centerline 61 in the window 30 of the semiconductor wafer 10, that is, in a region except a region to be formed with the second wirings 18. Etching is performed to the metal layer with using this resist film as a mask, thereby forming the second wirings 18. As a modification to this embodiment, the alignment marks 51a, 51b, 52a and 52c may be formed at this process step. Namely, this resist film is patterned so as to create a mask corresponding to the alignment marks, and the metal layer for the second wirings 18 is etched using this mask to create the alignment marks made of the metal layer. In another modification, the alignment marks 51a, 51b, 52a and 52c may be formed by etching the layer that forms the base layer of the cushioning member 17.

Figure 8:
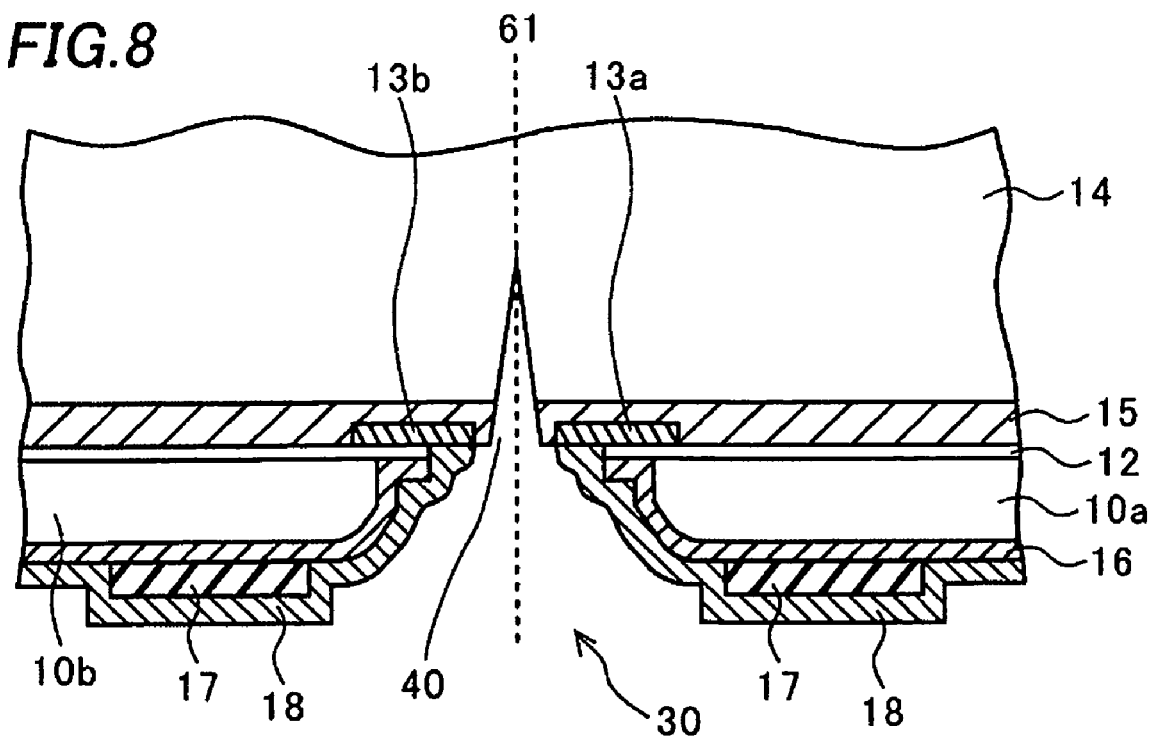

After the resist film (not shown) is removed, as shown in FIG. 8, cutting is performed to the back surface of the semiconductor wafer 10 along the centerline 61 to form a cut groove 40 having an inverse V shaped cross-section, for example, and reaching a part of the glass substrate 14. The rotation blade used for the cutting must have such a width that the blade does not reach end portions of the first wirings 13a and 13b in the window 30. A shape of the cross-section of this cut groove 40 is not limited to the inverse V shape and can be other shapes (e.g. a rectangle).

Prior to the cutting, positions of the alignment marks are detected (recognized) by the recognition camera 80, and an accurate position of the centerline 61 is calculated based on the detection result. Then, the rotation blade is aligned on the calculated centerline 61 and the cutting is performed by moving the rotation blade along the centerline 61. Cutting along the centerline 62 is performed in a similar manner to this.

The accurate positions of the centerlines 61 and 62 for cutting are determined based on the detection results of the positions of the pairs of alignment marks (51a, 51b) and (52a, 52c), respectively. Alternatively, each of the positions of the centerlines 61 and 62 is determined based on the detection result of an average value of the positions of the plural pairs of alignment marks on the dicing region 60. Then, a difference between the determined centerline and an original position of the rotation blade is calculated, and the position of the rotation blade is corrected by an amount of the difference.

In this process, the alignment marks are recognized for aligning the rotation blade on the centerline 61 for forming the cut groove 40, and the position for the cutting is determined based on the recognition result. At this time, it may be possible that the position for the cutting can be determined based on a result of recognizing both end portions of the facing second wirings 18 electrically connected with the first wirings 13a and 13b, for example. In this case, however, the position for cutting depends on states of the end portions of the second wirings 18. Since the end portions of the second wirings 18 are formed on a bottom of the window 30, accuracy in patterning is not high, different from an ordinary patterning process. The end portions need have more accurately patterned shapes in order to be used as marks for positional recognition. On the contrary, the alignment marks of this invention are patterned at a flat portion as usual, and thus the accuracy is high, thereby having high reliability as marks for positional recognition.

Then, as shown in FIG. 9, plating is performed to the second wirings 18 to form a plating film 19 made of, for example, Ni-Au.

Next, as shown in FIG. 10, a protection film 20 is formed on the back surface of the semiconductor wafer 10 including in the cut groove 40. At this time, for example, after the back surface of the semiconductor wafer 10 is turned upward, an organic resin is coated over the whole back surface of the semiconductor wafer 10 including the cut groove 40 by rotation coating of the organic resin. By this process, all the layers exposed in the cut groove 40, that is, exposed surfaces of the resin 15 and the glass substrate 14 are covered with the protection film 20.

Figure 11:
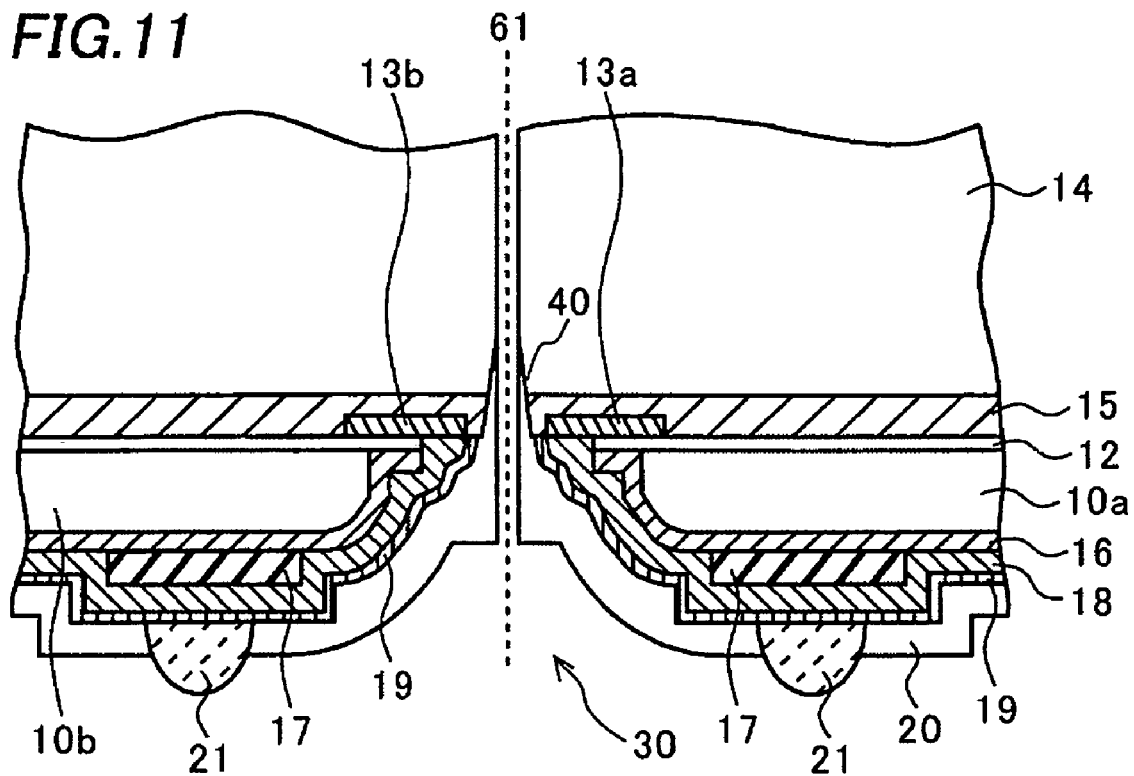

Then, as shown in FIG. 11, a resist film (not shown) is formed on the back surface of the semiconductor wafer 10, having openings in positions corresponding to the cushioning members 17. A part of the protection film 20 is removed by etching with using the resist film as a mask to form openings, and conductive terminals 21 are formed in the positions of the openings in the protection film 20.

Then, cutting is performed along the centerline 61 which is a center of the dicing region 60 to separate the semiconductor wafer 10 into individual semiconductor dies. Since the cut groove 40 is covered with the protection film 20, the cutting is performed to the glass substrate 14 and the protection layer 20 only. At this time, the rotation blade need have such a width that the blade does not reach the first wirings 13a and 13b and the resin 15 in the cut groove 40.

In this cutting process, in a similar manner to the case where the cut groove 40 is formed by cutting, the positions of the alignment marks are detected (recognized) by the recognition camera 80 before the cutting is performed, and the accurate position of the centerline 61 is calculated based on the detection result. Then, the rotation blade is aligned on the calculated centerline 61, and the cutting is performed with moving the rotation blade along the centerline 61. Cutting along the centerline 62 is performed in a similar manner to this.

Without the described method of the embodiment using the alignment marks, it is highly difficult to align the rotation blade in the above cutting processes (i.e. the cutting for forming the cut groove 40 and separating the semiconductor wafer 10) without fail.

Figure 12:
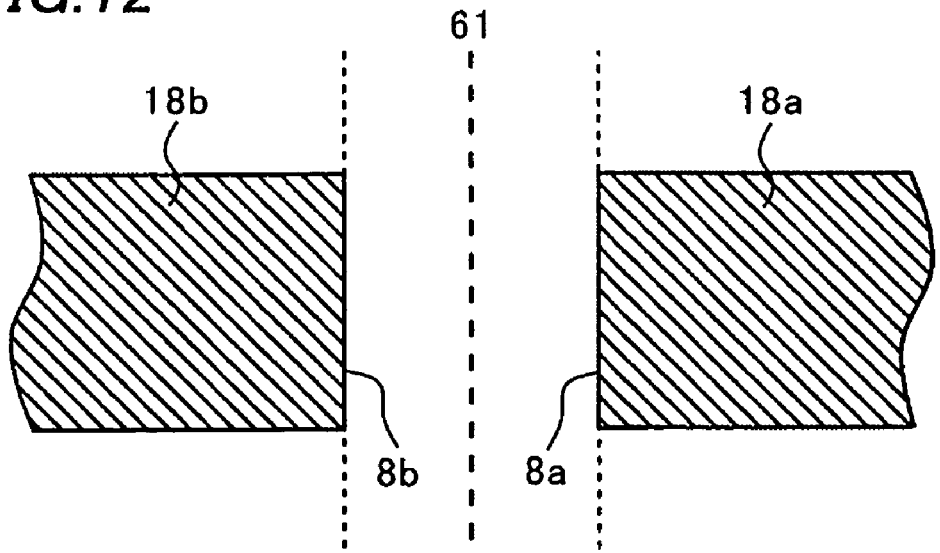
FIG. 12 is a plan showing a conventional positional detection.
Figure 13A:
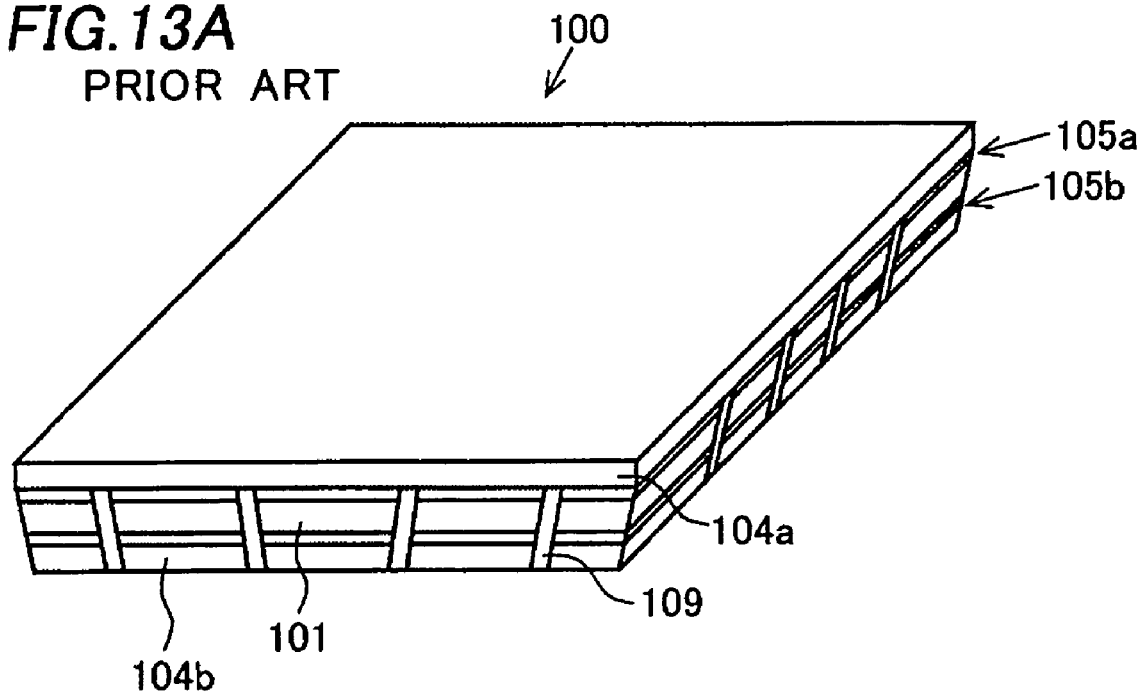
FIGS. 13A and 13B are perspective views showing a schematic structure of a semiconductor device of a conventional art.
Figure 13B:
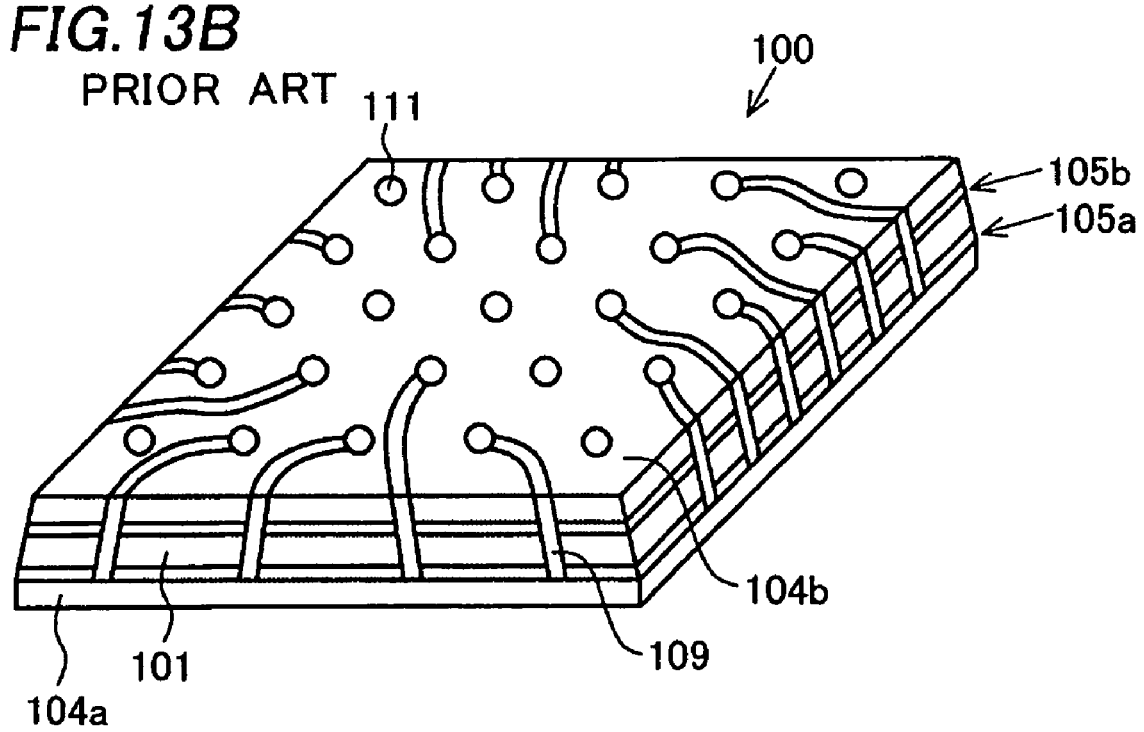
Figure 14:
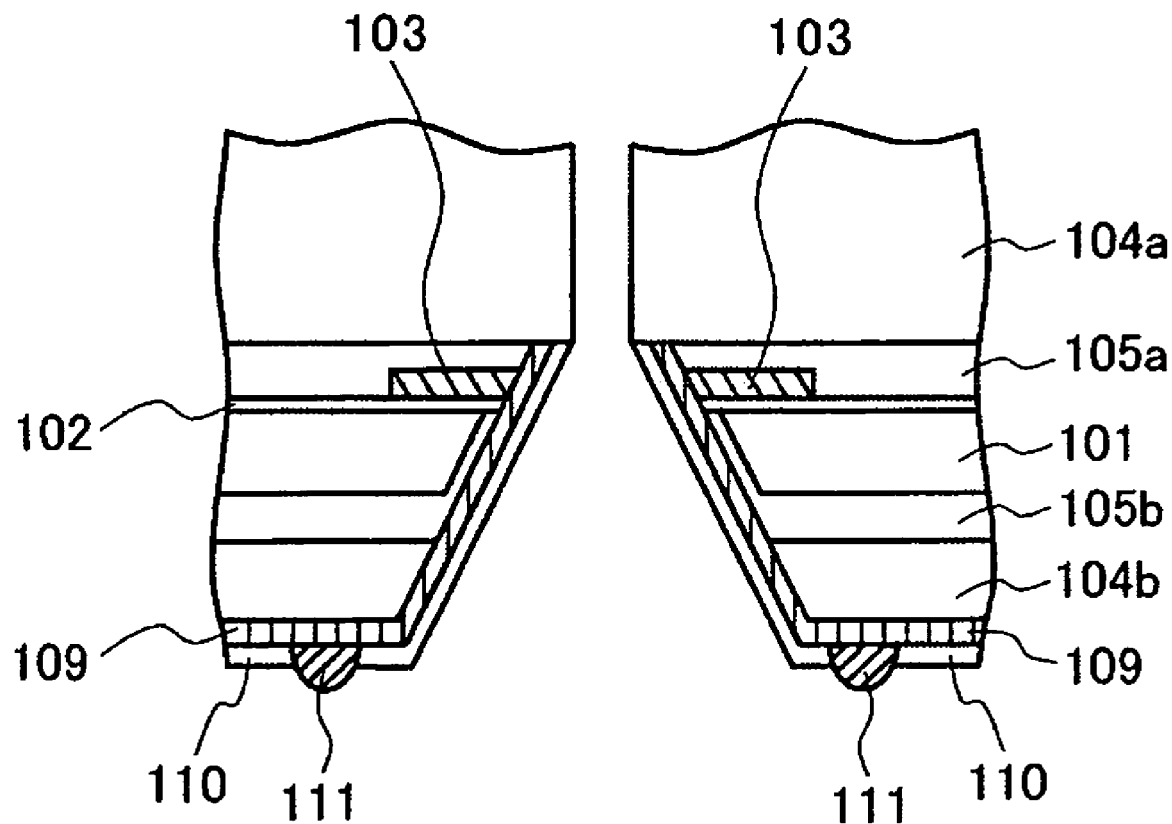
FIG. 14 is a cross-sectional view showing the structure of the semiconductor device of the conventional art.

In the case without the described method, the alignment of the rotation blade is performed, for example, by detecting the positions of the end portions 8a and 8b of the second wirings 18a and 18b exposed in the cut groove 40 by the recognition camera 80, calculating the center of the dicing region 60, that is, the centerline 61 based on the detection result, and aligning the rotation blade on the calculated centerline 61, as shown in FIG. 12 which is a plan view of an inside of the window 30 formed in the semiconductor wafer 10 seen from an upper side thereof. However, the end portions 8a and 8b of the second wirings 18a and 18b often have a fracture surface (surface having concave and convex portions) formed in the process for the formation, so that it is difficult to detect the positions accurately. This causes a problem that the position of the centerline 61 is calculated inaccurately based on the positions of the end portions 8a and 8b.

On the contrary, the semiconductor device manufacturing method of the embodiment using the alignment marks in the cutting processes does not depend on the positions of the end portions 8a and 8b of the second wirings 18a and 18b. Therefore, the alignment of the rotation blade can be performed more accurately, compared with the method employing the end portions 8a and 8b for the detection. Accordingly, the cutting accuracy in the semiconductor wafer can be improved.

Furthermore, the same alignment marks can be commonly used for a plurality of different cutting processes performed to the dicing region 60, that is, for both the formation of the cut groove 40 and the separation of the semiconductor wafer 10. Accordingly, in a case where a plurality of cutting processes is needed for the dicing region 60 as in the manufacturing method of the semiconductor device attached with a supporting member in the described embodiment, a positional shift in alignment of the rotation blade can be minimized. This can improve the cutting accuracy in the semiconductor wafer 10.

In the manufacturing method of the embodiment, the semiconductor device attached with the supporting member can be realized by using one sheet of a glass substrate while the yield decrease is prevented. An increase of a thickness and a manufacturing cost of the semiconductor device can be minimized, compared with a case of using two sheets of glass substrates.

Although the alignment of the rotation blade using the alignment marks is applied to the semiconductor device attached with one sheet of glass substrate in this embodiment, modifications are possible. That is, the invention is applicable to semiconductor devices having other structures such as a semiconductor device having two sheets of glass substrates attached to its two sides respectively.

What is claimed is:

1. A method of manufacturing a semiconductor device, comprising:
   providing a semiconductor wafer comprising a resin layer disposed on a front surface of the semiconductor wafer, a first electrode pad and a second electrode pad that are formed on the front surface, and a supporting member attached to the front surface by the resin layer, the semiconductor wafer comprising a plurality of semiconductor die regions;
   forming on a back surface of the semiconductor wafer a first alignment mark and a second alignment mark so that the first alignment mark is disposed in a first semiconductor die region and the second alignment mark is disposed in a second semiconductor die region that is next to the first semiconductor die region;
   detecting positions of the first and second alignment marks;
   calculating a middle position between the positions of the first and second alignment marks;
   aligning a blade with the calculated middle position on a side of the semiconductor wafer corresponding to the back surface; and
   cutting using the aligned blade at the calculated middle position the resin layer disposed on the front surface between the first and second electrode pads and along a predetermined direction.

2. The method of claim 1, wherein the predetermined direction is a direction normal to a direction connecting the first and second alignment marks.

3. The method of claim 1, wherein the detecting is performed using a recognition camera.

4. The method of claim 1, further comprising etching the semiconductor wafer from the back surface to expose the first and second electrode pads.

5. The method of claim 1, wherein the first and second alignment marks are formed of a material used in a manufacturing process of the semiconductor device.

6. The method of claim 1, wherein the first and second alignment marks are dents formed by etching.

7. The method of claim 1, further comprising another detecting of the positions of the first and second alignment marks, another calculating of the middle position, placing a blade at the calculated middle position, and cutting the supporting member at the calculated middle position along the predetermined direction so as to form individual semiconductor dies.

8. The method of claim 7, wherein the first and second alignment marks are formed of a material used in a manufacturing process of the semiconductor device.

9. The method of claim 7, wherein the first and second alignment marks are dents formed by etching.

10. The method of claim 1, wherein the first and second alignment marks are disposed with a first dicing region interposed there between, the first alignment mark being disposed at a corner of the first semiconductor die region and the second alignment mark being disposed at a corner of the second semiconductor die region adjacent to the first semiconductor die region.

11. The method of claim 10, further comprising forming on the back surface of the semiconductor wafer a third alignment mark and a fourth alignment mark, wherein the third and fourth alignment marks are disposed with a second dicing region interposed there between, the second dicing region crossing the first dicing region, the third alignment mark being disposed at a corner of the first semiconductor die region and the fourth alignment mark being disposed at a corner of a third semiconductor die region, the third semiconductor die region being adjacent to the first semiconductor die region.

12. A method of manufacturing a semiconductor device, comprising:
   providing a semiconductor wafer comprising a layer disposed on a front surface of the semiconductor wafer, a first electrode pad and a second electrode pad that are formed on the front surface, and a supporting member attached to the front surface forming on a back surface of the semiconductor wafer a first alignment mark and a second alignment mark;

detecting positions of the first and second alignment marks;

calculating a middle position between the positions of the first and second alignment marks;

aligning a blade with the calculated middle position on a side of the semiconductor wafer corresponding to the back surface; and cutting using the aligned blade at the calculated middle position the layer disposed on the front surface between the first and second electrode pads and along a predetermined direction, wherein the blade reaches the supporting member so as to form a groove in the supporting member.

13. The method of claim 12, further comprising forming a protection film on the back surface of the semiconductor wafer including in the groove.

* * * * *